(12) United States Patent
Chiou et al.

(10) Patent No.: US 8,692,334 B2
(45) Date of Patent: Apr. 8, 2014

(54) RESISTOR INTEGRATED WITH TRANSISTOR HAVING METAL GATE

(71) Applicant: United Microelectronics Corp., Hsin-Chu (TW)

(72) Inventors: Chun-Mao Chiou, Chiayi County (TW); Ti-Bin Chen, Tainan (TW); Tsung-Min Kuo, Tainan (TW); Shyan-Liang Chou, Tainan (TW); Yao-Chang Wang, Tainan (TW); Chi-Sheng Tseng, Tainan (TW); Jie-Ning Yang, Ping-Tung County (TW); Po-Jui Liao, Taichung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/949,230

(22) Filed: Jul. 24, 2013

(65) Prior Publication Data
US 2013/0307084 A1 Nov. 21, 2013

Related U.S. Application Data

(62) Division of application No. 13/419,437, filed on Mar. 14, 2012, now Pat. No. 8,524,556.

(51) Int. Cl.
*H01L 21/70* (2006.01)

(52) U.S. Cl.
USPC ............... 257/380; 257/538; 257/E27.016; 438/238

(58) Field of Classification Search
None
See application file for complete search history.

(56) References Cited

U.S. PATENT DOCUMENTS

| 8,193,900 B2 * | 6/2012 | Fan et al. ............. 338/309 |
| 8,477,006 B2 * | 7/2013 | Yang et al. ............. 338/314 |
| 2004/0140508 A1 * | 7/2004 | Sengoku et al. ............ 257/379 |
| 2007/0093015 A1 * | 4/2007 | Kudo et al. ............. 438/199 |
| 2007/0096183 A1 | 5/2007 | Ogawa |
| 2009/0236669 A1 | 9/2009 | Chen et al. |
| 2010/0099229 A1 * | 4/2010 | Chiu et al. ............. 438/238 |
| 2010/0328022 A1 * | 12/2010 | Fan et al. ............. 338/309 |
| 2011/0057267 A1 | 3/2011 | Chuang |
| 2012/0217586 A1 * | 8/2012 | Chern et al. ............. 257/380 |
| 2013/0049168 A1 * | 2/2013 | Yang et al. ............. 257/538 |
| 2013/0049924 A1 * | 2/2013 | Yang et al. ............. 338/314 |
| 2013/0126979 A1 * | 5/2013 | Chern et al. ............. 257/379 |

* cited by examiner

*Primary Examiner* — Julio J Maldonado
*Assistant Examiner* — Molly Reida
(74) *Attorney, Agent, or Firm* — Winston Hsu; Scott Margo

(57) ABSTRACT

A method of manufacturing a resistor integrated with a transistor having metal gate includes providing a substrate having a transistor region and a resistor region defined thereon, a transistor is positioned in the transistor region and a resistor is positioned in the resistor region; forming a dielectric layer exposing tops of the transistor and the resistor on the substrate; performing a first etching process to remove portions of the resistor to form two first trenches respectively at two opposite ends of the resistor; forming a patterned protecting layer in the resistor region; performing a second etching process to remove a dummy gate of the transistor to form a second trench in the transistor region; and forming a metal layer filling the first trenches and the second trench.

6 Claims, 16 Drawing Sheets

US 8,692,334 B2

RESISTOR INTEGRATED WITH TRANSISTOR HAVING METAL GATE

CROSS REFERENCE TO RELATED APPLICATIONS

This application is a divisional of application Ser. No. 13/419,437 filed Mar. 14, 2012, and included herein by reference.

BACKGROUND OF THE INVENTION

1. Field of the Invention

The invention relates to a resistor and a manufacturing method thereof, and more particularly, to a resistor and a method of manufacturing a resistor integrated with a transistor having metal gate.

2. Description of the Prior Art

To increase the performance of transistors, metal gates are prevalently used in the semiconductor field: the metal gates competent to the high dielectric constant (high-k) gate dielectric layer are used to replace the traditional polysilicon gates to be the control electrode. The metal gate approach can be categorized to the gate first process and the gate last process. And the gate last process gradually replaces the gate first process because a range of material choices for the high-k gate dielectric layer and the metal gate are expanded.

Additionally, resistors are elements which are often used for providing regulated voltage and for filtering noise in a circuit. The resistors generally include polysilicon and silicide layers.

In the current semiconductor field, though the fabricating processes are improved with the aim of reaching high yields, it is found that integration of the manufacturing methods of those different kinds of semiconductor devices is very complicated and difficult. Therefore, a method for fabricating a resistor integrated with a transistor having metal gate is still in need.

SUMMARY OF THE INVENTION

According to an aspect of the present invention, a method of manufacturing a resistor integrated with a transistor having metal gate is provided. The method includes providing a substrate having a transistor region and a resistor region defined thereon, a transistor is positioned in the transistor region and a resistor is positioned in the resistor region; forming a dielectric layer exposing tops of the transistor and of the resistor on the substrate; performing a first etching process to remove portions of the resistor to form two first trenches respectively at two opposite ends of the resistor; forming a patterned protecting layer in the resistor region; performing a second etching process to remove a dummy gate of the transistor to form a second trench in the transistor; and forming a metal layer filling the first trenches and the second trench on the substrate.

According another aspect of the present invention, a resistor integrated with a transistor having metal gate is provided. The resistor includes a substrate having a transistor region and a resistor region defined thereon, a transistor positioned in the transistor region, the transistor further comprising a metal gate, and a resistor positioned in the resistor region. The resistor further includes a polysilicon portion, a pair of conductive terminals respectively positioned at two opposite ends of the polysilicon portion, and two protecting layers respectively positioned in between the polysilicon portion and the conductive terminal. The conductive terminals and the metal gate include a same structure.

According to the resistor and the manufacturing method provided by the present invention, the first trenches and the second trench for forming the conductive terminals and the metal gate are formed sequentially and separately, therefore the polysilicon lose problem that always found when simultaneously removing the first trenches and the second trench is mitigated. Furthermore, by forming the patterned protecting layer in the first trenches, the polysilicon lose problem is completely avoided, and thus profiles of the polysilicon portion of the resistor is remained intact. Consequently, resistance, reliability and stability of the resistor are all ensured.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 are schematic drawings illustrating a method of manufacturing a resistor integrated with a transistor having metal gate provided by a first preferred embodiment of the present invention, wherein FIG. 2 is a schematic drawing in a step subsequent to FIG. 1, FIG. 3 is a schematic drawing illustrating a modification to the present invention, FIG. 4 is a schematic drawing in a step subsequent to FIG. 2, FIG. 5 is a schematic drawing in a step subsequent to FIG. 4, FIG. 6 is a schematic drawing in a step subsequent to FIG. 5, FIG. 7 is a schematic drawing illustrating another modification to the preferred embodiment, FIG. 8 is a schematic drawing in a step subsequent to FIG. 6, and FIG. 9 is a schematic drawing in a step subsequent to FIG. 8.

FIGS. 10-14 are schematic drawings illustrating a method of manufacturing a resistor integrated with a transistor having metal gate provided by a second preferred embodiment of the present invention, wherein FIG. 11 is a schematic drawing in a step subsequent to FIG. 10, FIG. 12 is a schematic drawing in a step subsequent to FIG. 11, FIG. 13 is a schematic drawing in a step subsequent to FIG. 12, and FIG. 14 is a schematic drawing in a step subsequent to FIG. 13.

DETAILED DESCRIPTION

Figure 1:
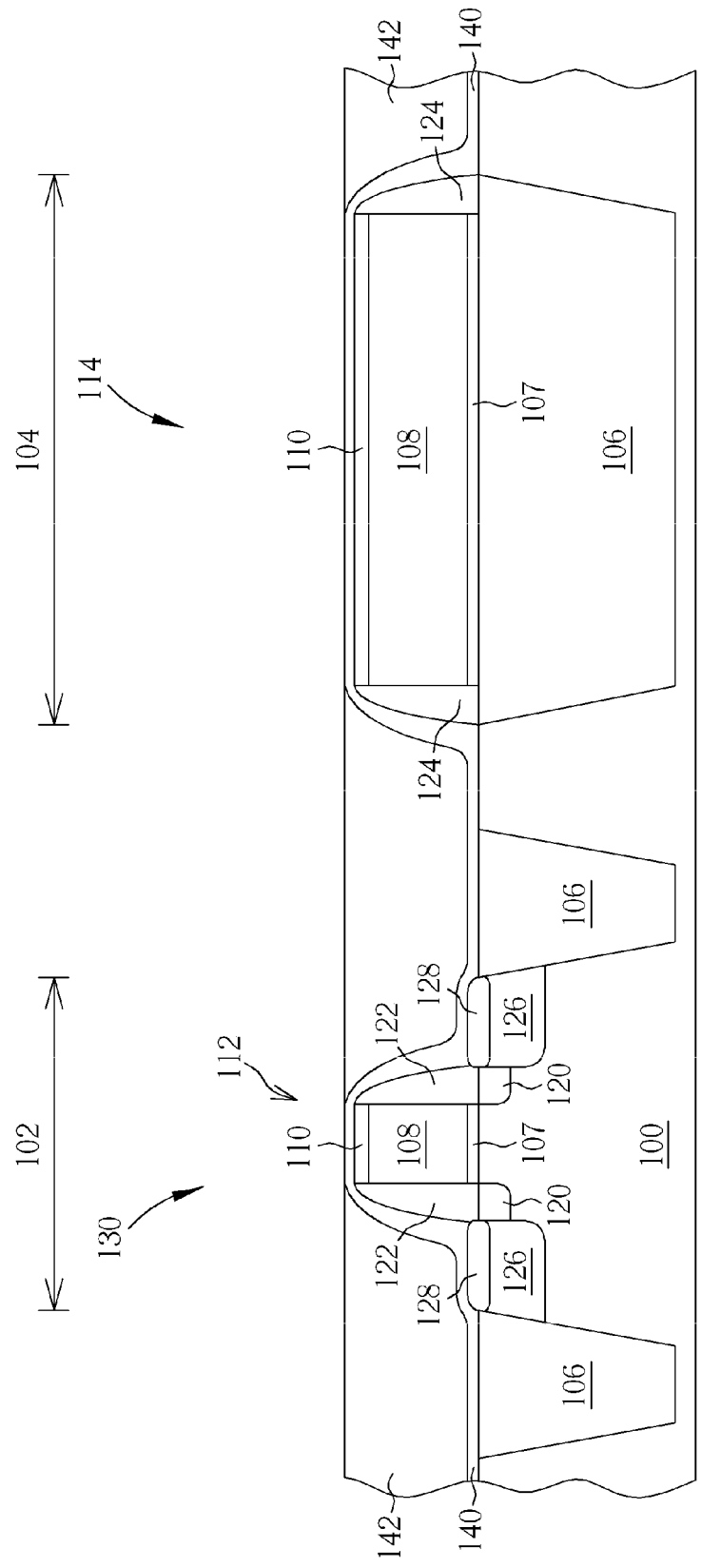

Please refer to FIGS. 1-9, which are schematic drawings illustrating a method of manufacturing a resistor integrated with a transistor having metal gate provided by a first preferred embodiment of the present invention. As shown in FIG. 1, a substrate 100 having a transistor region 102 and a resistor region 104 defined thereon is provided. The substrate 100 also includes a plurality of shallow trench isolations (STIs) 106 positioned in between devices for providing electrical isolation. It is noteworthy that a STI 106 is formed in the resistor region 104 for accommodating a resistor. Then, a dielectric layer 107, a polysilicon layer 108, and a patterned hard mask 110, which is used to define positions for a transistor and a resistor, are sequentially formed on the substrate 100. In the preferred embodiment, the method of manufacturing the resistor integrated with the transistor having metal gate is integrated with the high-k first process, therefore the dielectric layer 107 includes a high dielectric constant (high-k) materials such as rare earth metal oxide and serves as the gate dielectric layer for the transistor. The high-k gate dielectric layer 107 can include material selected from the group consisting of hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate, (SrBi$_2$Ta$_2$O$_9$, SBT), lead zirconate titanate (PbZr$_x$Ti$_{1-x}$O$_3$, PZT), and barium strontium titanate (Ba$_x$Sr$_{1-x}$TiO$_3$, BST).

Please refer to FIG. 1 again. Next, an etching process is performed to etch the polysilicon layer 108 and the dielectric layer 107 through the patterned hard mask 110. Consequently, a dummy gate 112 is formed in the transistor region 102 and a resistor 114 is formed in the resistor region 104, respectively. Then, lightly-doped drains (LDDs) 120 are formed in the substrate 100 respectively at two sides of the dummy gate 112 and followed by forming spacers 122, 124 on sidewalls of the dummy gate 112 and the resistor 114, respectively. Subsequently, a source/drain 126 is formed in the substrate 100 at two sides of the dummy gate 112, particularly at two sides of the spacer 122. Thus a transistor 130 having the dummy gate 112 is obtained. Additionally, silicide 128 can be formed on surfaces of the source/drain 126 of the transistor 130.

Please still refer to FIG. 1. After forming the transistor 130 and the resistor 114, a contact etch stop layer (CESL) 140 and an inter-layer dielectric (ILD) layer 142 are sequentially formed to cover the transistor 130 and the resistor 114. Since the steps and material choices for the abovementioned elements are well-known to those skilled in the art, those details are omitted herein in the interest of brevity. Furthermore, selective strain scheme (SSS) can be used in the preferred embodiment. For example, a selective epitaxial growth (SEG) method can be used to form the source/drain 126. After forming the CESL 140 and the ILD layer 142, a planarization process is performed to remove a portion of the CESL 140 and a portion of the ILD layer 142 to expose the CESL 140 on tops of the transistor 130 and the resistor 114.

Figure 2:
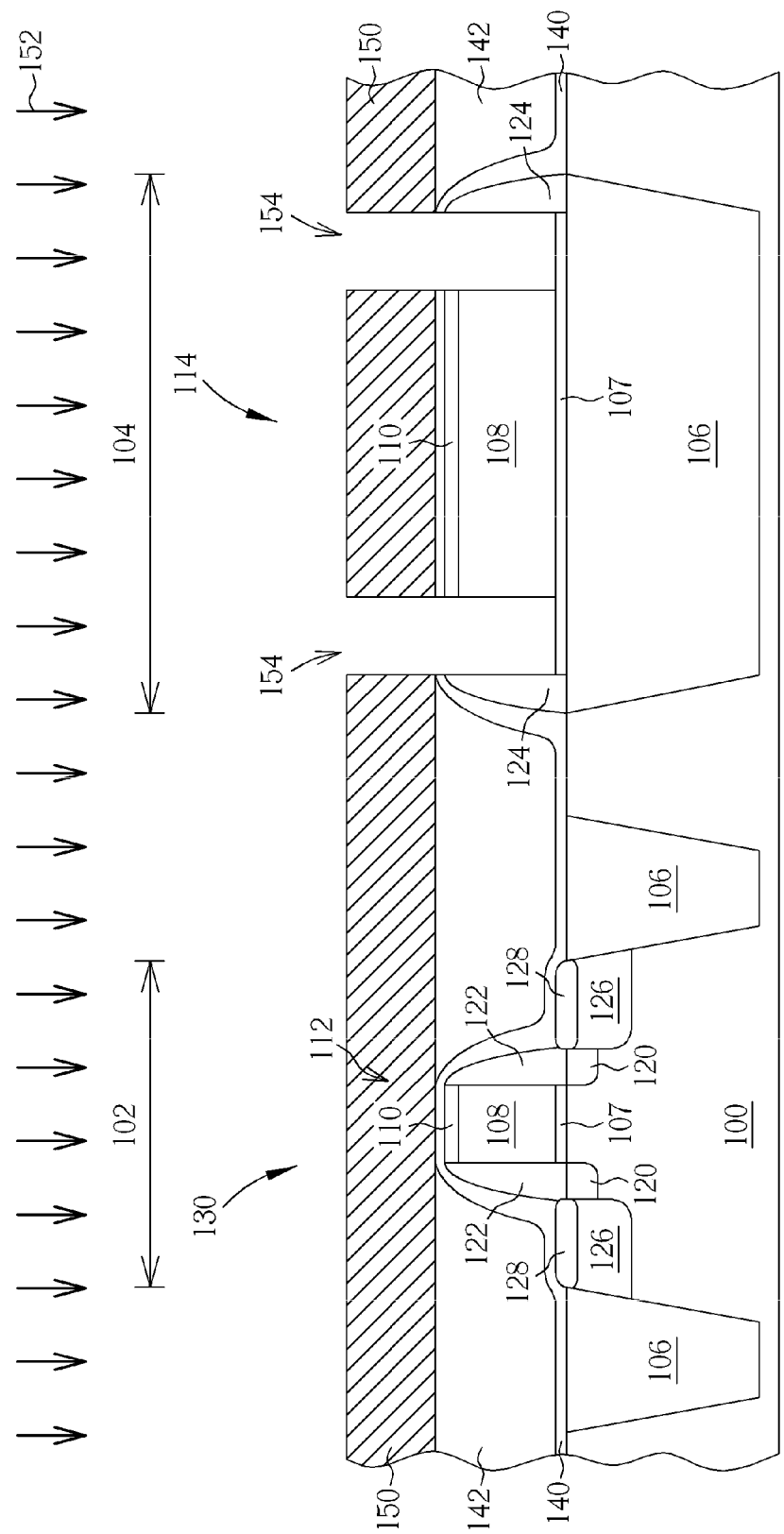

Please refer to FIG. 2. Next, a patterned mask 150 is formed on the substrate 100. The patterned mask 150 covers the entire transistor region 102 and a portion of the resistor 114 in the resistor region 104. It is noteworthy that two opposite ends of the resistor 114 are exposed for defining positions for the terminals. Subsequently, an etching process 152 is performed to remove the exposed portions of the CESL 140, the patterned hard mask 110, and the resistor 114. As shown in FIG. 2, two first trenches 154 are formed respectively at the two opposite ends of the resistor 114 consequently. And the dielectric layer 107 is exposed in bottoms of the first trenches 154.

Figure 3:
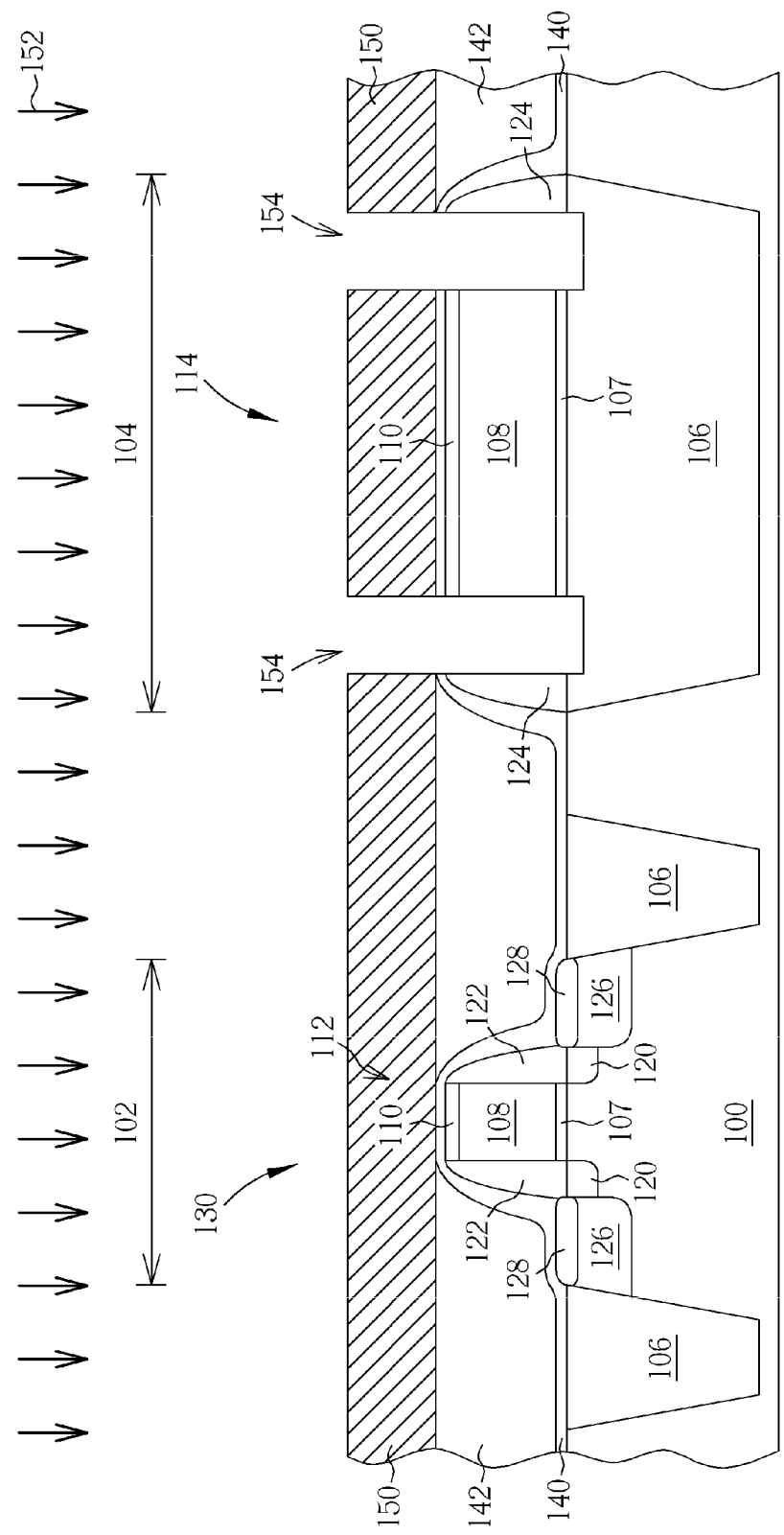

Please refer to FIG. 3, which is a schematic drawing illustrating a modification to the preferred embodiment. According to the modification, an over-etching is intended to be achieved during the etching process 152 for forming the first trenches 154. Accordingly, the polysilicon 108 and the dielectric layer 107 in the first trenches 154 are completely removed, even the STI 106 under the dielectric layer 107 is etched. Consequently, the STI 106 is exposed in the bottoms of the first trenches 154. In other words, the bottoms of the first trenches 154 are lower than surfaces of the STI 106 and surface of the dielectric layer 107 as shown in FIG. 3.

Figure 4:
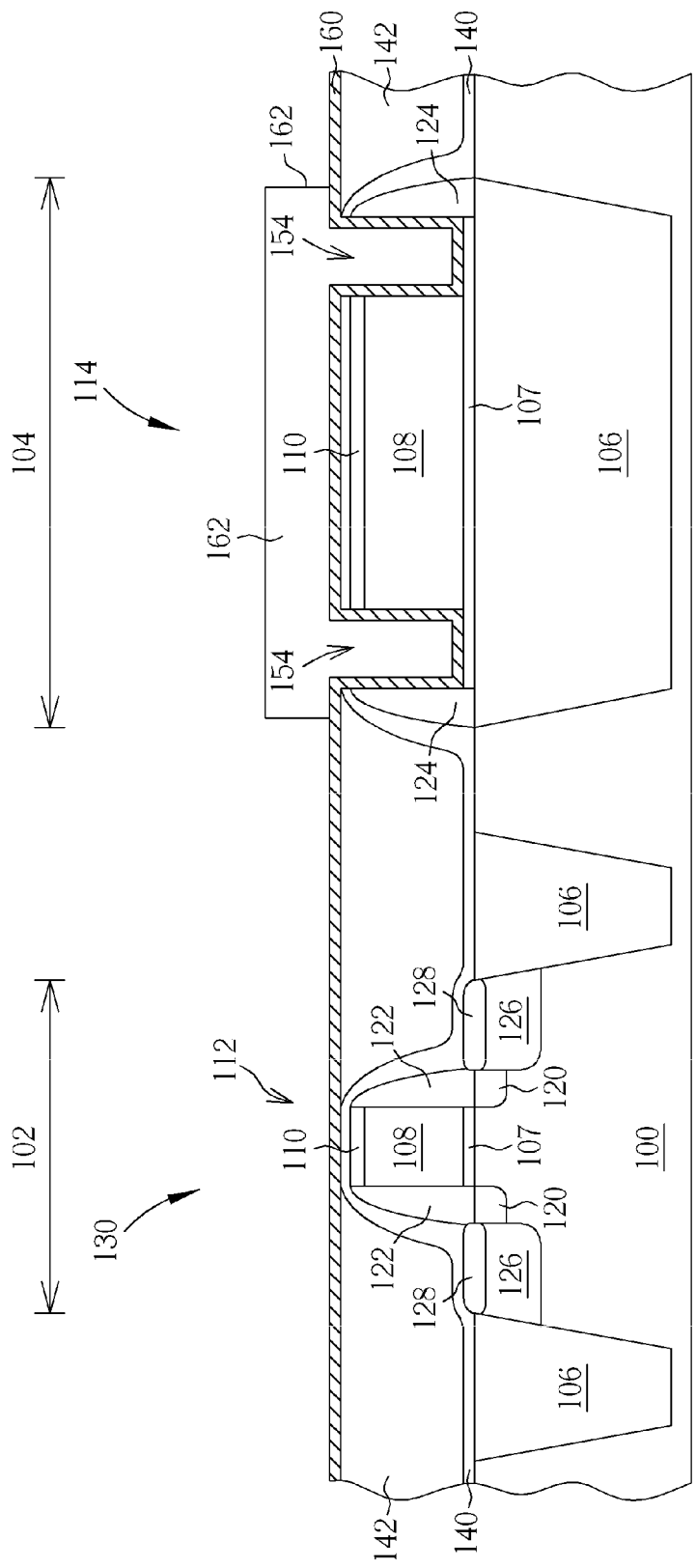

Please refer to FIG. 4. After forming the first trenches 154, the patterned mask 150 is removed and followed by forming a protecting layer 160 on the substrate 100. The protecting layer 160 can include conductive materials such as tantalum (Ta) or titanium nitride (TiN), but not limited to this. As shown in FIG. 4, the protecting layer 160 covers sidewalls and bottoms of the first trenches 154, however the first trenches 154 are not filled up by the protecting layer 160. In addition, the protecting layer 160 can include a metal layer such as a nickel layer, and thus a self-aligned silicide process is performed after forming the nickel layer. Accordingly, the nickel layer in the first trenches 154 reacts with the polysilicon material which forms the sidewalls of the first trenches 154. Consequently, metal salicide layers are obtained. After forming the protecting layer 160, a patterning process is performed. As shown in FIG. 4, the patterning process includes forming a patterned photoresist 162 on the protecting layer 160 in the resistor region 104. It is noteworthy that the patterned photoresist 162 fills up each first trench 154.

Figure 5:
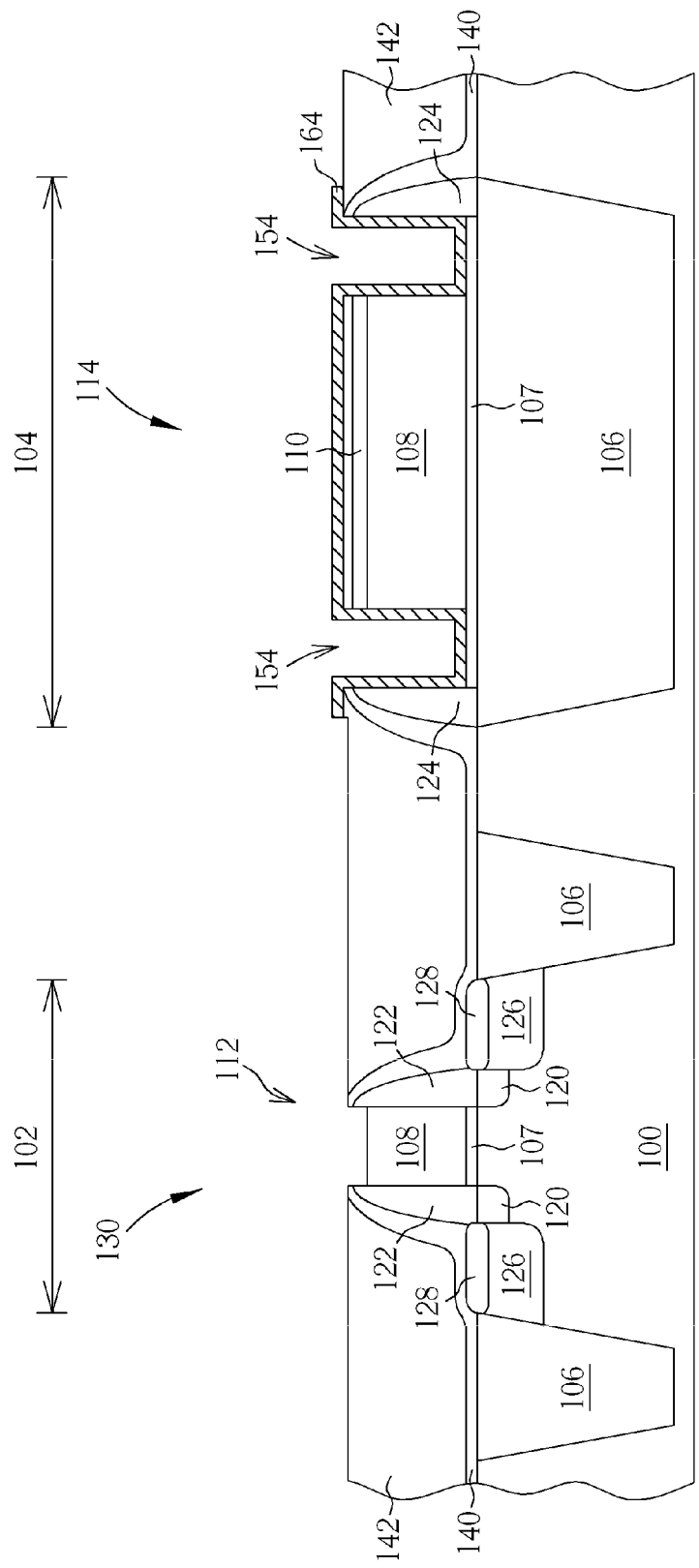

Please refer to FIG. 5. After forming the protecting layer 160 and the patterned photoresist 162, the protecting layer 160 not covered by the patterned photoresist 162 is removed and thus a patterned protecting layer 164 is obtained. As shown in FIG. 5, the patterned protecting layer 164 covers the sidewalls and the bottoms of each first trench 154. It is also noteworthy that when the protecting layer 160 includes the metal salicide layer, the patterning process can be directly performed without forming the patterned photoresist 162. In such case, the protecting layer not reacting with the polysilicon layer 108, which forms the sidewalls of the first trenches 154, is removed. Thus the patterned protecting layer 164 covering the sidewalls of the first trenches 154 is obtained.

Please still refer to FIG. 5. After forming the patterned protecting layer 164, the patterned photoresist 162 is removed and followed by removing the exposed portion of the ILD layer 142 and of the CESL 140 in-situ. Therefore, the patterned hard mask 110 on top of the dummy gate 112 is exposed. Subsequently, the exposed patterned hard mask 110 is removed to expose the dummy gate 112 as shown in FIG. 5.

Figure 6:
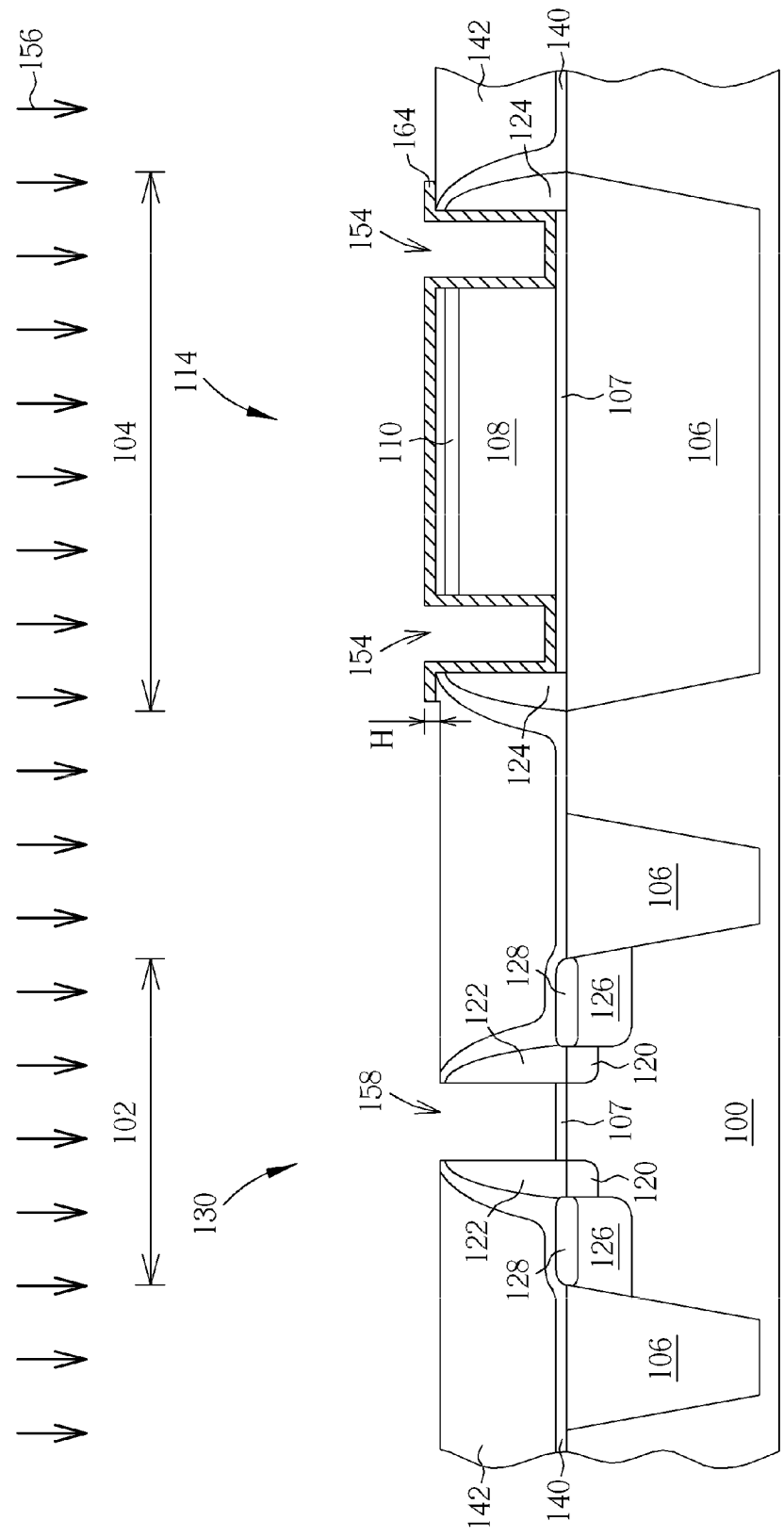
Figure 7:
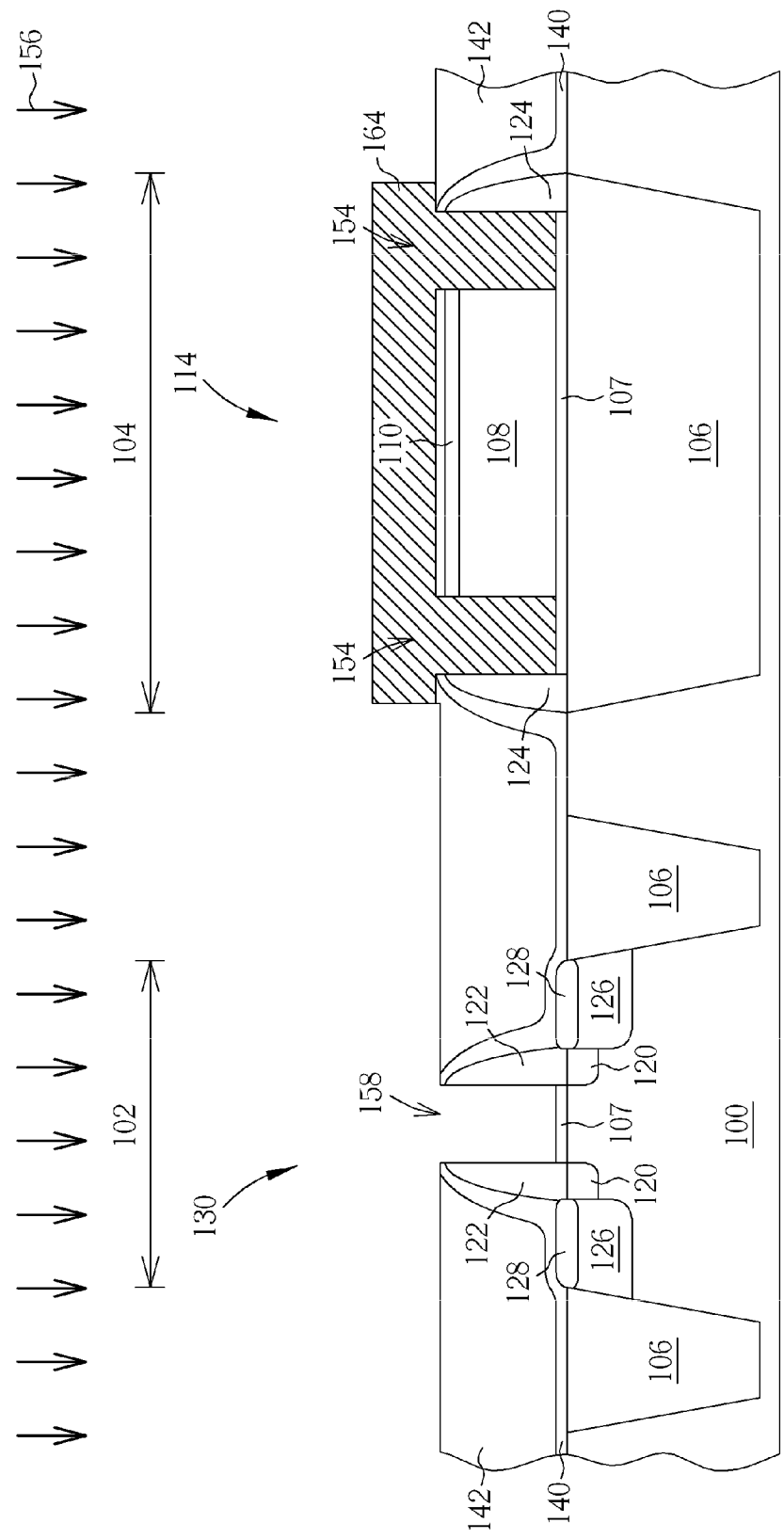

Please refer to FIG. 6. A suitable etching process 156, such as a multi-step etching is then performed. The multi-step etching process preferably includes performing a dry etching and a wet etching process in sequence and removes the polysilicon layer 108 of the dummy gate 112, thus a second trench 158 is formed in the transistor region 102. It is noteworthy that during removing the dummy gate 112, the sidewalls of the first trenches 154 in the resistor region 104 are covered by the patterned protecting layer 164. In other words, the polysilicon layer 108 in the sidewalls of the first trenches 154 is protected by the patterned protecting layer 164 and remains eminently intact and impervious to the etching process 156. Also, please refer to FIG. 7, which is a schematic drawing illustrating another modification to the preferred embodiment. According to the modification, the patterned protecting layer 164 includes a patterned photoresist layer, and the patterned photoresist layer 164 fills up the first trenches 154 for protecting the polysilicon layer 108 during the etching process 156. However, in such case that the patterned protecting layer 164 being a patterned photoresist layer, a portion of the patterned photoresist layer 164, particularly the portion on the polysilicon sidewalls of the first trenches 154, must be removed after removing the dummy gate 112 of the transistor 130 to form the second trench 158.

Figure 8:
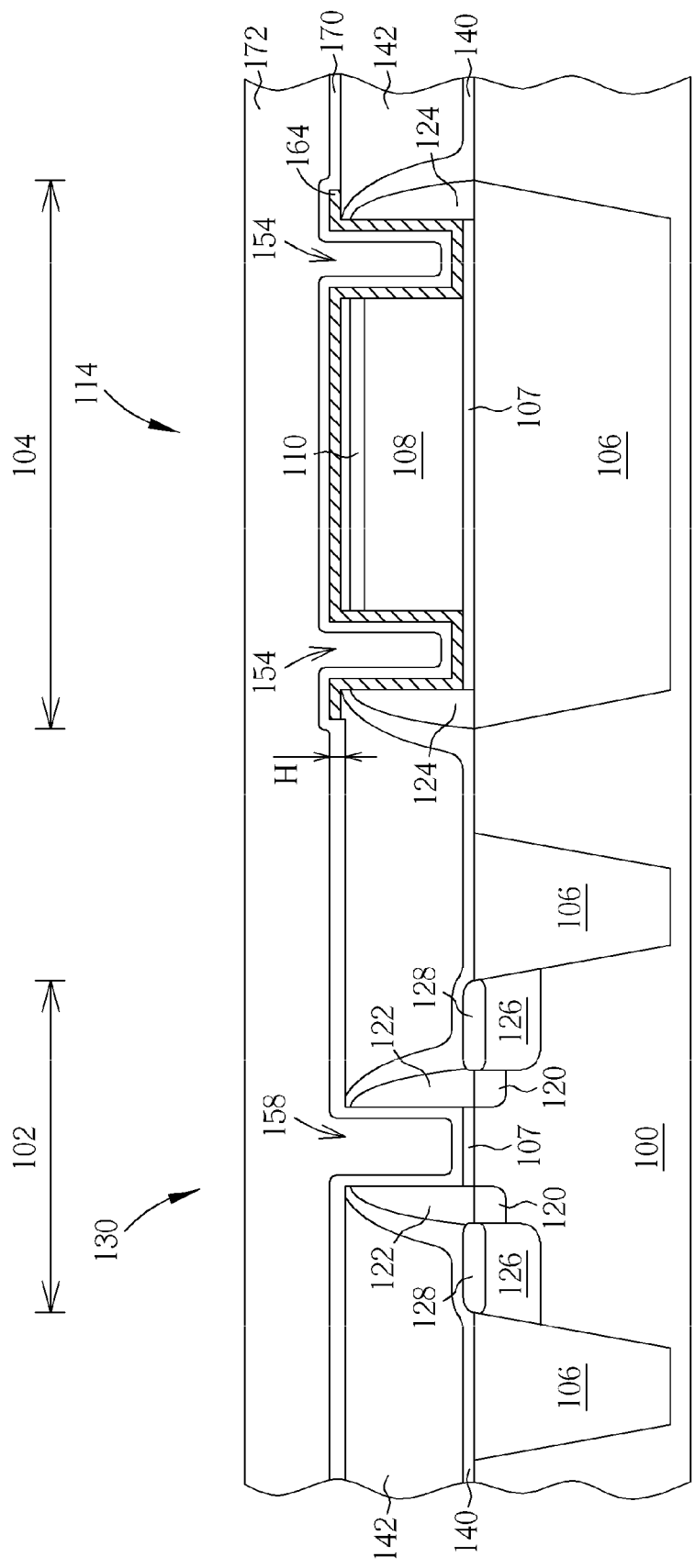

Please refer to FIG. 8. After forming the second trench 158, a chemical vapor deposition (CVD) or a physical vapor deposition (PVD) process is performed to form a work function metal layer 170 in the first trenches 154 and the second trench 158. According to the preferred embodiment, the work function metal layer 170 can include suitable materials providing an appropriate work function for p-type transistor or n-type transistor. Therefore, the work function metal layer 170 has a work function, and the work function can be between 4.8 eV and 5.2 eV, or alternatively between 3.9 eV and 4.3 eV. Furthermore, the work function metal layer 170 can be a single-layered structure or a multilayered structure. Additionally, a bottom barrier layer (not shown) can be formed between the work function metal layer 170 and the dielectric layer 107 if required. After forming the work function metal layer 170, a filling metal layer 172 is formed on the work function metal layer 170 in the first trenches 154 and the second trench 158. The filling metal layer 172 fills up the first trenches 154 and the second trench 158, and includes materials with low resistance and superior gap-filling characteristic, such as aluminum (Al), titanium aluminide (TiAl) or titanium aluminum oxide (TiAlO), but not limited to this. Additionally, a top barrier layer (not shown) for example but not limited to a TiN layer can be formed between the work function metal layer 170 and the filling metal layer 172 if required.

Figure 9:
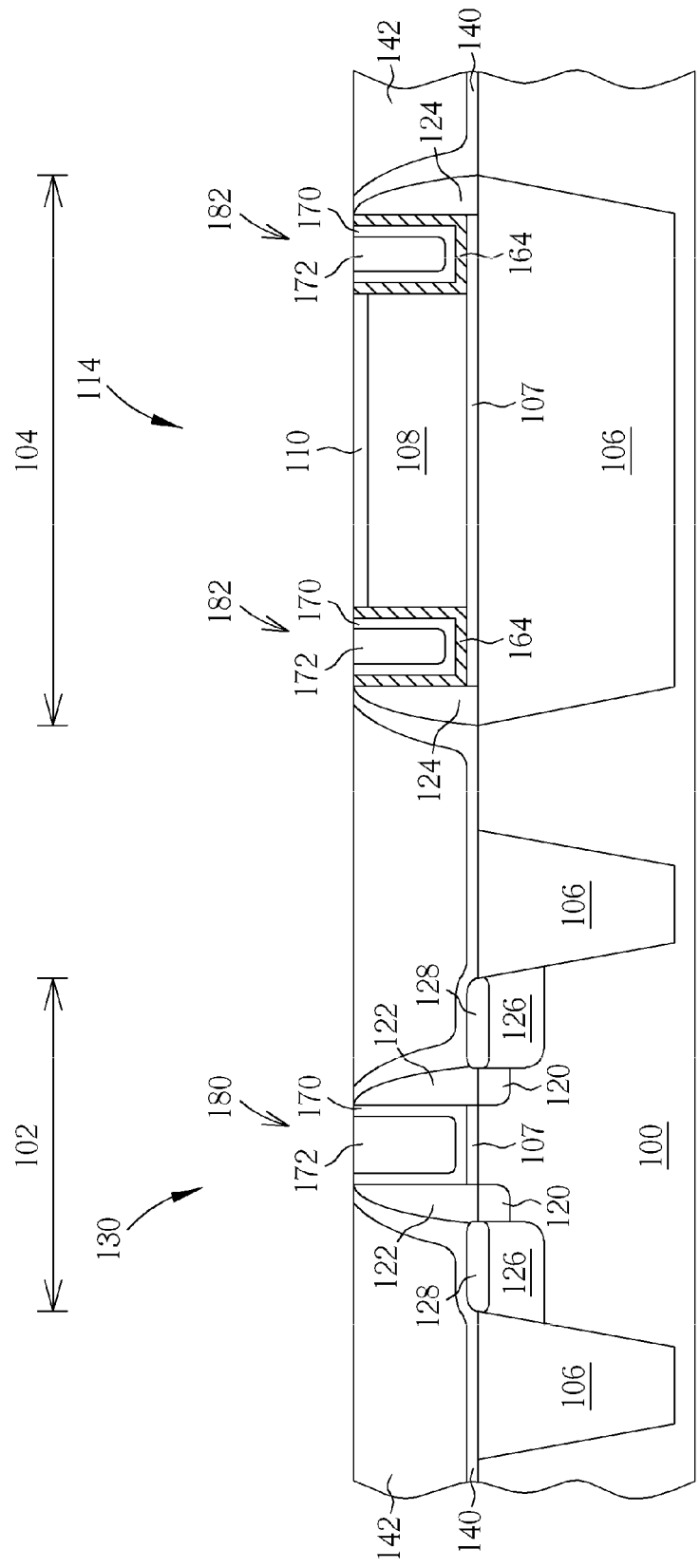

Please refer to FIG. 9. After forming the work function metal layer 170 and the filling metal layer 172, a planarization process such as a CMP process is performed to remove the unnecessary filling metal layer 172, work function metal layer 170, and patterned protecting layer 164. Consequently, a metal gate 180 for the transistor 130 is obtained. More important, two metal structures serving as conductive terminals 182 for the resistor 114 are obtained in the first trenches 154 in the resistor region 104. It is noteworthy that the patterned protecting layer 164 or the metal salicide layer 164 is positioned between the conductive terminal 182 and the polysilicon portion 108 of the resistor 114.

According to the method of manufacturing the resistor integrated with the transistor having metal gate provided by the preferred embodiment, the first trenches 154 in the resistor region 104 and the second trench 158 in the transistor region 102 are formed sequentially and separately, therefore influence to the polysilicon portion 108 in the resistor region 104 rendered by the etching process 156 is mitigated. Furthermore, by forming the patterned protecting layer 164, the polysilicon sidewalls 108 of the first trenches 154 is completely protected from the etching process 156 and thus its original vertical profile remains intact. Accordingly, the transistor integrated with the transistor having metal gate obtains expected resistance and superior stability.

Please refer to FIGS. 10-14, which are schematic drawings illustrating a method of manufacturing a resistor integrated with a transistor having metal gate provided by a second preferred embodiment of the present invention. It is noteworthy that elements the same in both first and second preferred embodiments can include the same material, therefore those details are omitted herein in the interest of brevity. First of all, please refer to FIG. 6 of the first preferred embodiment. It is found that the ILD layer 142 lose occurs at the edges of the patterned protecting layer 164 during removing the dummy gate 112 to form the second trench 158, and thus a step height H is resulted between the patterned protecting layer 164 and the adjacent ILD layer 142. Such step height H further results in metal remnant issue after performing the CMP process to remove the unnecessary the filling metal layer 172 and the work function metal layer 170.

Figure 10:
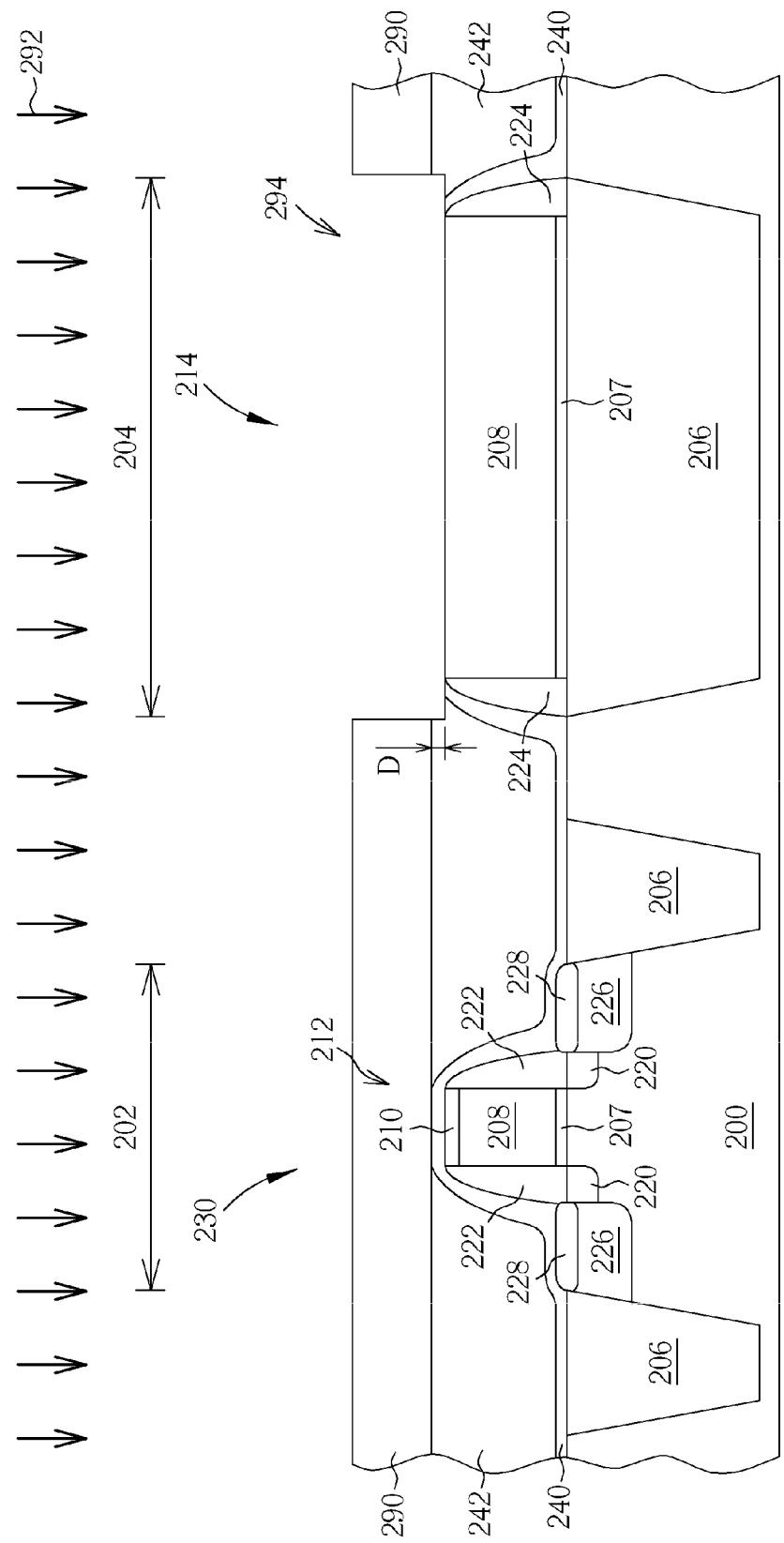

Please refer to FIG. 10. According to the preferred embodiment, a substrate 200 having a transistor region 202 and a resistor region 204 is provided. The substrate 200 also includes a plurality of STIs 206 formed therein. Subsequently, steps as mentioned in the first preferred embodiment are performed to form a transistor 230 in the transistor region 202 and a resistor 214 in the resistor region 204, respectively. As shown in FIG. 10, the transistor 230 includes a dummy gate 212, LDDs 220, a spacer 222, a source/drain 226, and silicides 228 formed on surface of the source/drain 226. Furthermore, the dummy gate 212 include a high-k gate dielectric layer 207, a polysilicon layer 208, and a patterned hard mask 210 used to define position of the dummy gate 212. The resistor 214 includes a dielectric layer 207, a polysilicon layer 208, a patterned hard mask (not shown) used to define position of the resistor 214, and a spacer 224. After forming the transistor 230 and the resistor 214, a CESL 240 and an ILD layer 242 covering the transistor 230 and the resistor 214 are sequentially formed on the substrate 200. Then, a planarization process is performed to remove a portion of the ILD layer 242 to expose the CESL 240 on tops of the transistor 230 and the resistor 214.

Please refer to FIG. 10 again. Next, a patterned mask 290 is formed on the substrate 200. The patterned mask 290 covers the entire transistor region 202 but exposes the resistor region 204. Subsequently, an etching process 292 is performed to remove a portion of the ILD layer 242, the CESL 224, and the patterned hard mask exposed in the resistor region 204. Thus a recess 294 having a depth D is formed in the resistor region 204. As shown in FIG. 10, a bottom of the recess 294 is lower than a surface of the ILD layer 242. Furthermore, the polysilicon portion 208 of the resistor 214 is exposed in the bottom of the recess 294.

Figure 11:
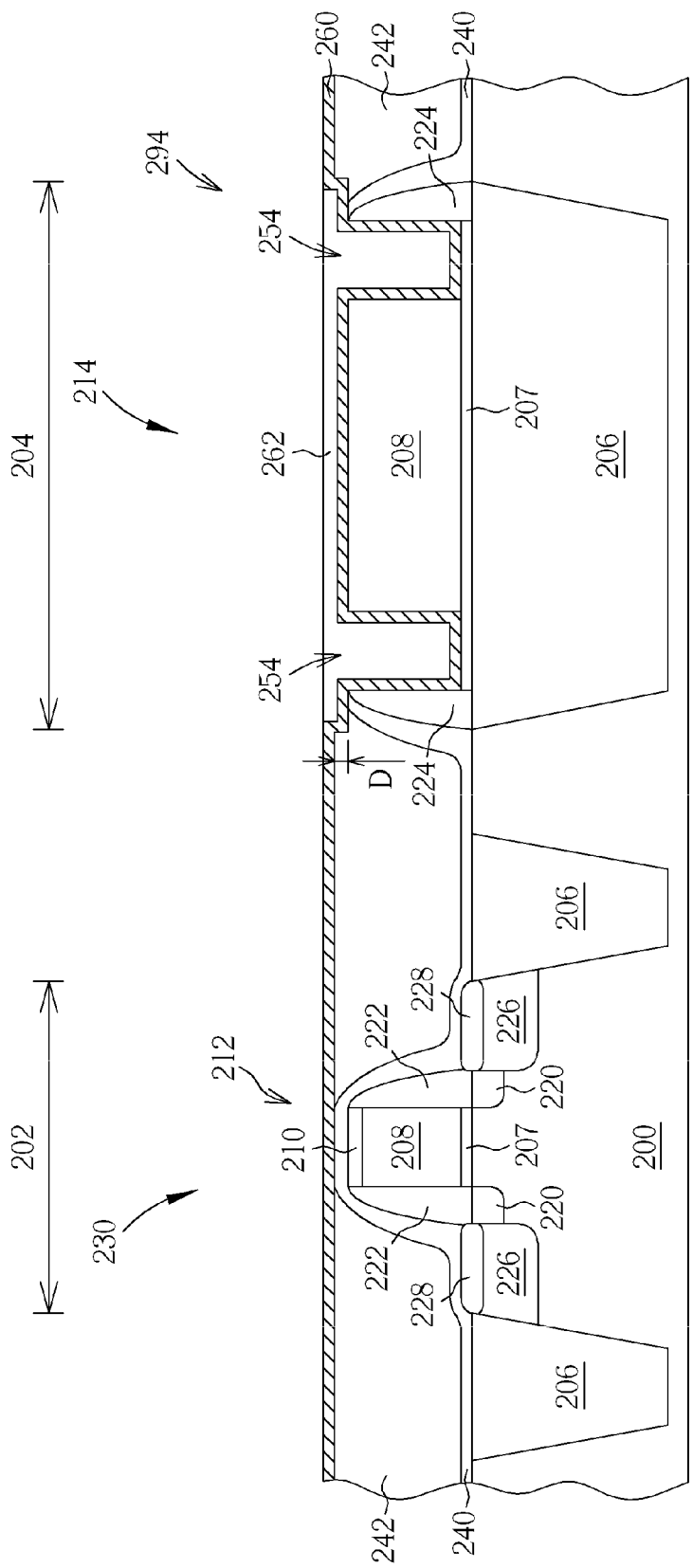

Please refer to FIG. 11. Next, a patterned mask (not shown) is formed on the substrate 200. The patterned mask covers the entire transistor region 202 and a portion of the resistor 214 in the resistor region 204. Thus two opposite ends of the resistor 214 are exposed. Subsequently, an etching process as mentioned in the first preferred embodiment is performed to remove the exposed polysilicon layer 208 in the resistor region 204. As shown in FIG. 11, two first trenches 254 are formed respectively at the two opposite ends of the resistor 214. And the dielectric layer 207 is exposed in bottoms of the first trenches 254. Also as shown in FIG. 11, openings of the first trenches 254 are formed at the bottom of the recess 294.

In addition, an over-etching is intended to be achieved during the etching process for forming the first trenches 254 as mentioned in the first preferred embodiment. Accordingly, the polysilicon layer 208 and the dielectric layer 207 in the first trenches 254 are completely removed, even the STI 206 under the dielectric layer 207 is etched. Consequently, the STI 206 is exposed in the bottoms of the first trenches 254. In other words, the bottoms of the first trenches 254 are lower than the surfaces of the STI 206 and the surface of the dielectric layer 207.

Pleas still refer to FIG. 11. After forming the first trenches 254, the patterned mask is removed and followed by forming a protecting layer 260 on the substrate 200. It is noteworthy that the protecting layer 260 covers not only the sidewalls and bottom of the first trenches 254, but also the sidewalls and bottom of the recess 294. However the first trenches 254 and the recess 294 are not filled up by the protecting layer 260. After forming the protecting layer 260, a patterning process is performed. As shown in FIG. 11, the patterning process includes forming a patterned photoresist 262 on the protecting layer 260. It is noteworthy that the patterned photoresist 262 fills up the first trenches 254 and the recess 294. The patterned photoresist 262 can have a surface higher than a surface of the protecting layer 260 in the transistor region 202. The protecting layer 260 can include conductive materials such as Ta or TiN. The protecting layer 260 also can include a Ni layer and thus a metal salicide layer is formed on the polysilicon sidewalls 208 of the first trenches 254 by a self-aligned silicide process in such case.

Figure 12:
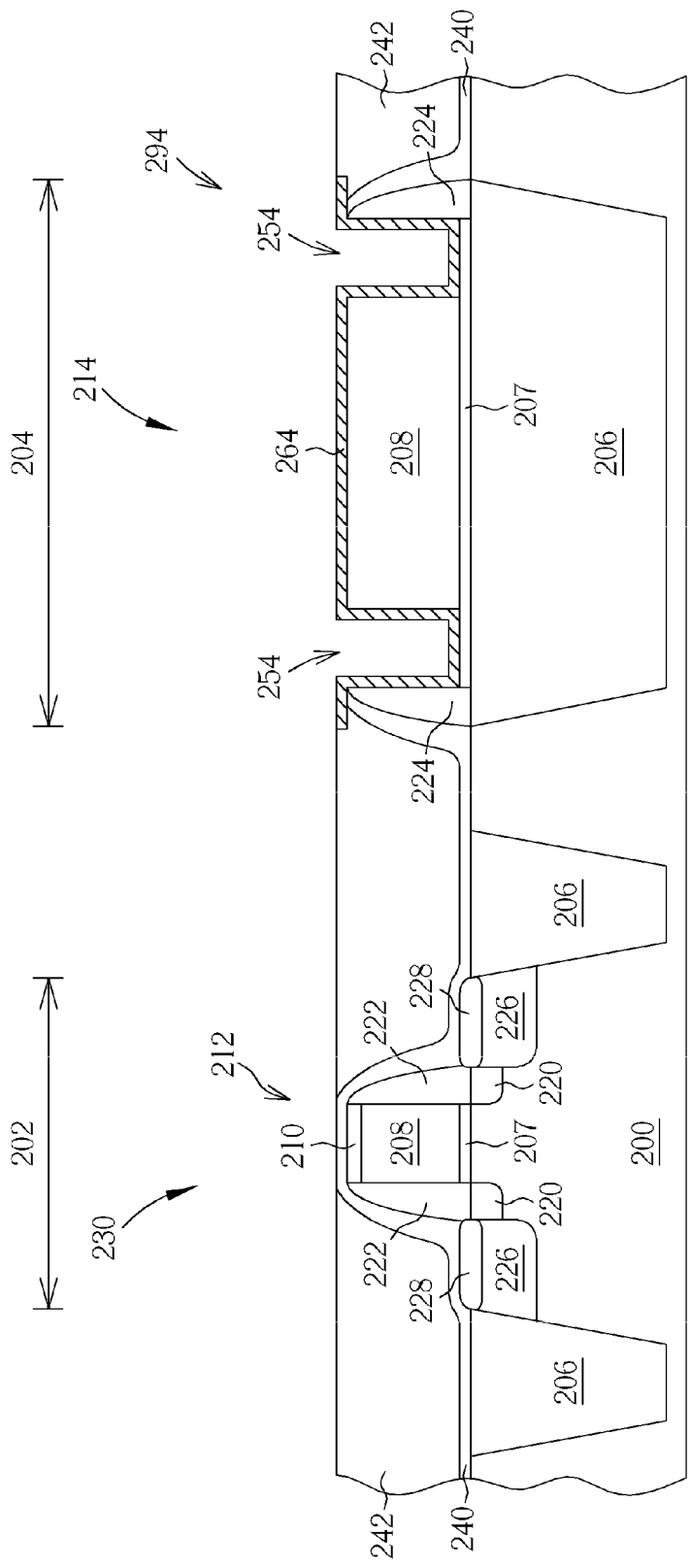

After forming the protecting layer 260 and the patterned photoresist 262, the protecting layer 260 not covered by the patterned photoresist 262 is removed, and thus a patterned protecting layer 264 is obtained in the resistor region 204 as shown in FIG. 12. Subsequently, the patterned photoresist 262 is removed. The patterned protecting layer 264 covers the sidewalls and the bottoms of the recess 294 and of the first trenches 254.

Figure 13:
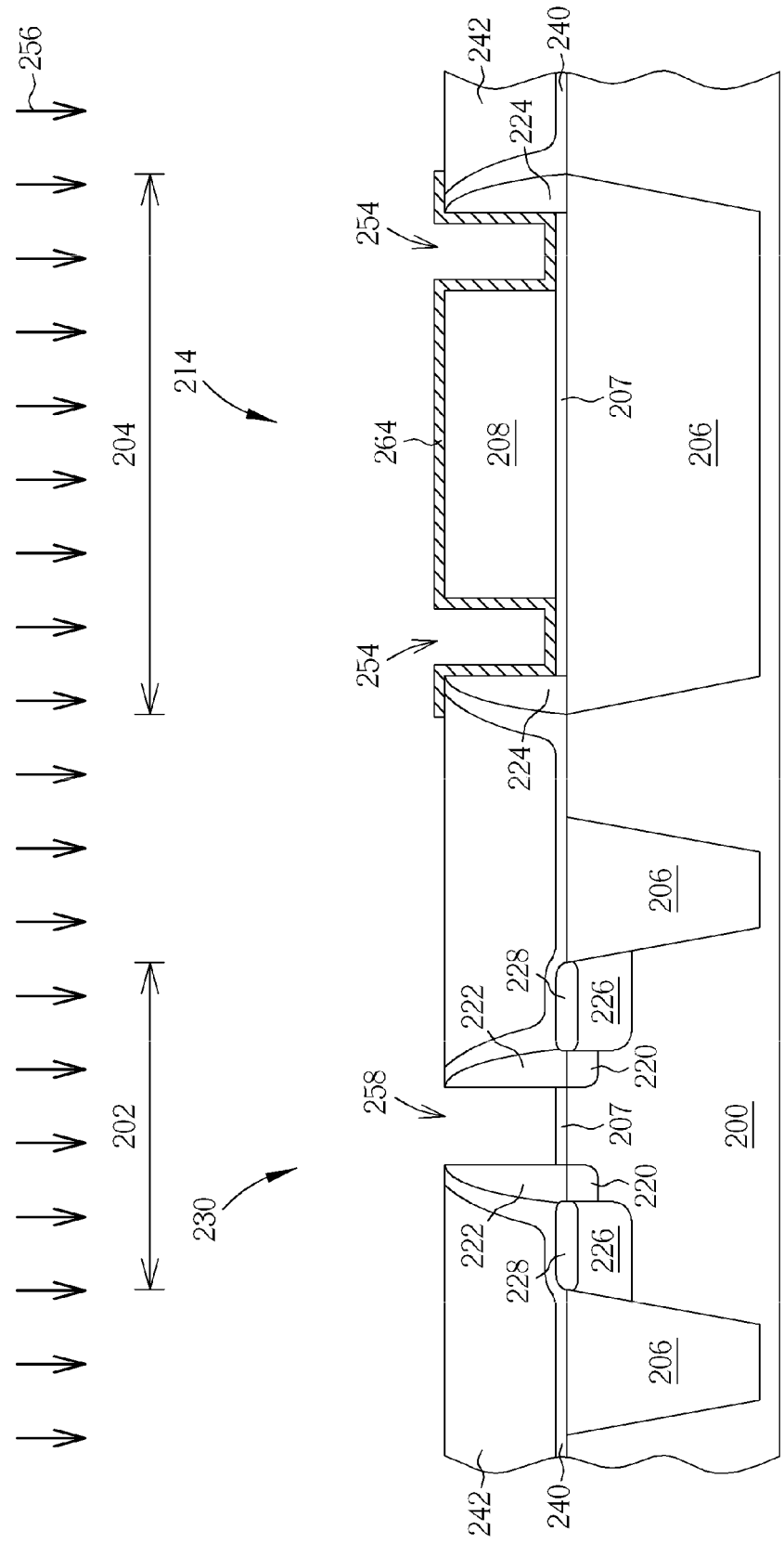

Please refer to FIGS. 12 and 13. After forming the patterned protecting layer 264, an etching process is performed to remove the exposed portion of ILD layer 242 and of the CESL 240. Therefore, the patterned hard mask 210 on top of the dummy gate 212 is exposed. Subsequently, the exposed patterned hard mask 210 is removed to expose the polysilicon layer 208 of the dummy gate 212. It is noteworthy that after removing the exposed portions of the ILD layer 242 and the CESL 242, the surface of the remained ILD layer 242 and the bottom of the recess 294 are co-planar. In other words, the recess 294 is eliminated after removing the portions of the ILD layer 242 and the CESL 240, and thus no step height is found on the surface of the ILD layer on the substrate 200.

Please refer to FIG. 13 again. Next, a suitable etching process 256, such as a multi-step etching is then performed. The multi-step etching process preferably includes performing a dry etching and a wet etching process in sequence, and removes the polysilicon layer 208 of the dummy gate 212, thus a second trench 258 is formed in the transistor region 202 as shown in FIG. 13. It is noteworthy that during removing the dummy gate 212, the sidewalls of the first trenches 254 in the resistor region 204 are covered by the patterned protecting layer 264. In other words, the polysilicon layer 208 in the sidewalls of the first trenches 254 is protected by the patterned protecting layer 264 and remains eminently intact and impervious to the etching process 256. Also, the patterned protecting layer 264 can include a patterned photoresist layer, and the patterned photoresist layer 264 fills up the first trenches 254 and the recess 294 for protecting the polysilicon sidewall of the first trenches 254 and the polysilicon bottom of the recess 294 during the etching process 256. However, in such case that the patterned protecting layer 264 being a patterned photoresist layer, a portion of the patterned photoresist layer 264, particularly the portion on the polysilicon sidewalls of the first trenches 254, must be removed after removing the dummy gate 212 of the transistor 230 to form the second trench 258.

Figure 14:
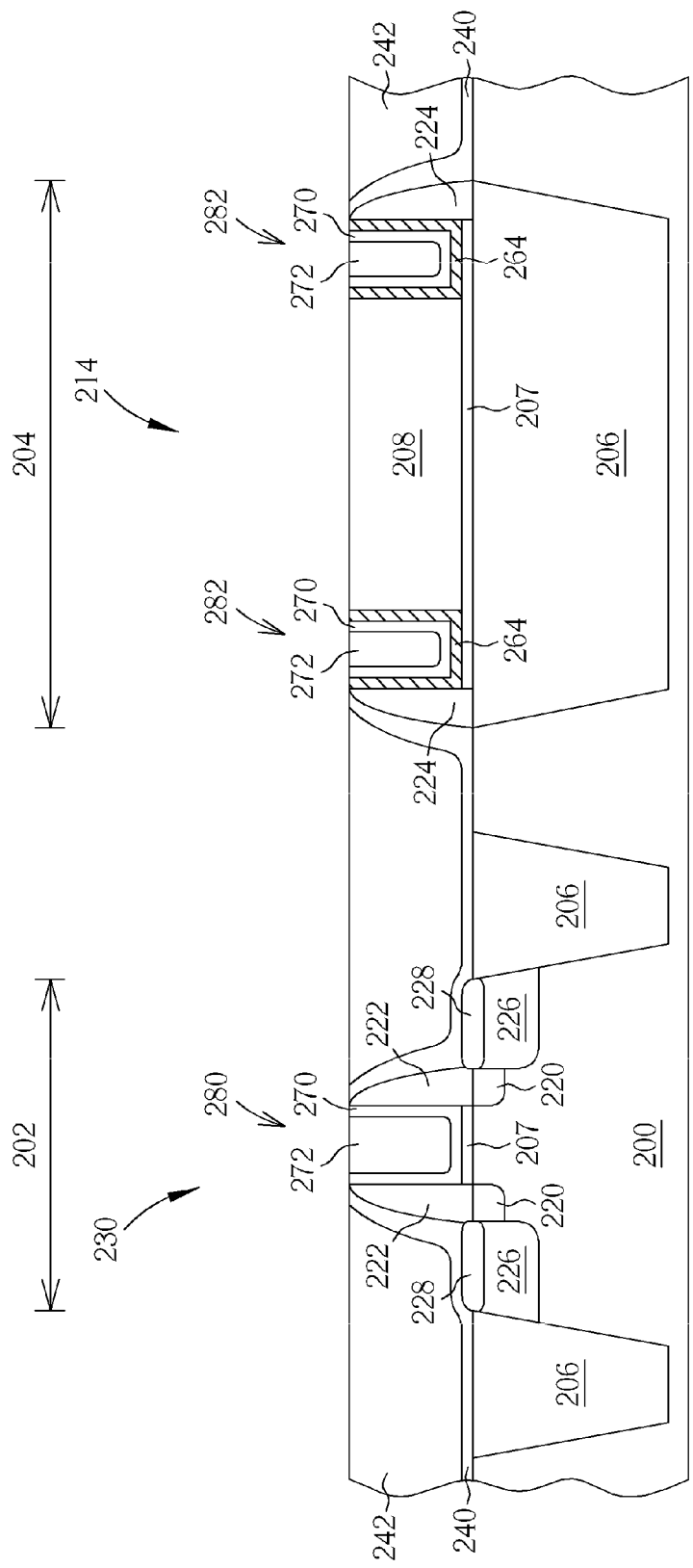

Please refer to FIG. 14. After forming the second trench 258, a CVD or a PVD process is performed to form a work function metal layer 270 in the first trenches 254 and the second trench 258. According to the preferred embodiment, the work function metal layer 270 can include suitable materials providing an appropriate work function for p-type transistor or n-type transistor. Furthermore, the work function metal layer 270 can be a single-layered structure or a multi-layered structure. Additionally, a bottom barrier layer (not shown) can be formed between the work function metal layer 270 and the dielectric layer 207 if required. After forming the work function metal layer 270, a filling metal layer 272 is formed on the work function metal layer 270 in the first trenches 254 and the second trench 258. The filling metal layer 272 fills up the first trenches 254 and the second trench 258. Additionally, a top barrier layer (not shown) can be formed between the work function metal layer 270 and the filling metal layer 272 if required.

Please still refer to FIG. 14. After forming the filling metal layer 272, a planarization process such as a CMP process is performed to remove the unnecessary filling metal layer 272, work function metal layer 270, and patterned protecting layer 264. Consequently, a metal gate 280 for the transistor 230 is obtained in the transistor region 202. More important, two metal structures serving as conductive terminals 282 for the resistor 214 are obtained in the first trenches 254 in the resistor region 204. In other words, the conductive terminals 282 and the metal gate 280 include a same structure. It is noteworthy that the patterned protecting layer 264 or the metal salicide layer 264 is positioned between the conductive terminal 282 and the polysilicon portion 208 of the resistor 214.

According to the method of manufacturing the resistor integrated with the transistor having metal gate provided by the preferred embodiment, the recess 294 is formed in the resistor region 204 to avoid the step height that might be germinated in the following processes and thus the metal remnant issue is prevented. Also, by forming the first trenches 254 in the resistor region 204 and the second trench 258 in the transistor region 202 sequentially and separately, and by forming the patterned protecting layer 264, the polysilicon sidewalls 208 of the first trenches 254 is protected from the etching process 256 and thus its original vertical profile remains intact. Accordingly, the transistor integrated with the transistor having metal gate obtains expected resistance and superior stability.

Figure 15:
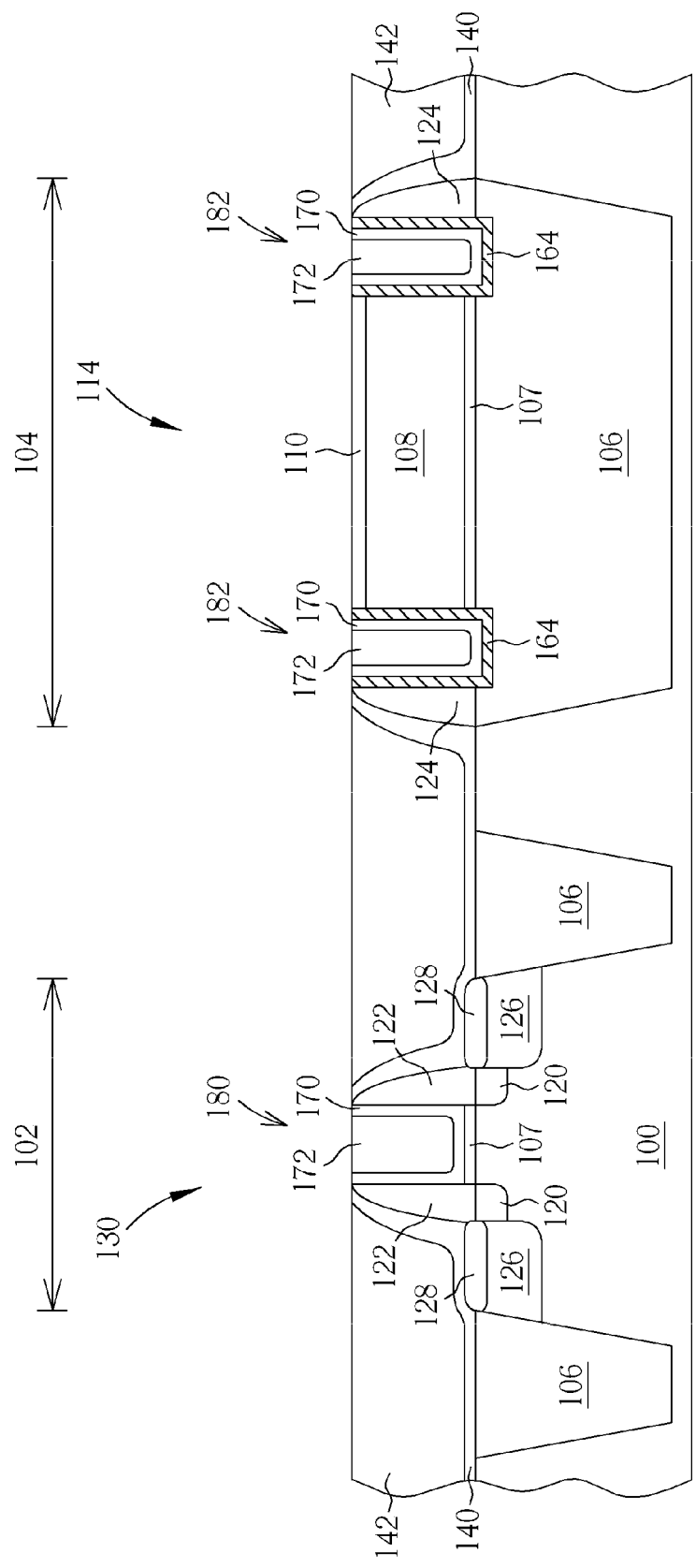
FIG. 15 is a schematic drawing in a step subsequent to FIG. 3.

Please further refer to FIG. 15, which is a schematic illustrating step subsequent to FIG. 3. As shown in FIG. 15, after over-etching the STI 106 to form the first trenches 154 having the bottoms lower than the surface of the STI 106 by the etching process 152, steps as mentioned in first or second preferred embodiments are performed to form the conductive terminals 182 in the first trenches 154 and the metal gate 180 in the transistor 130 simultaneously. According to the modification, the conductive terminals 182 not only embedded in the resistor 114 entirely, but also at least a portion of the conductive terminals 182 is embedded in the STI 106, therefore bottoms of the conductive terminals 182 and the patterned protecting layers 164 are all lower than the surface of STI 106.

Figure 16:
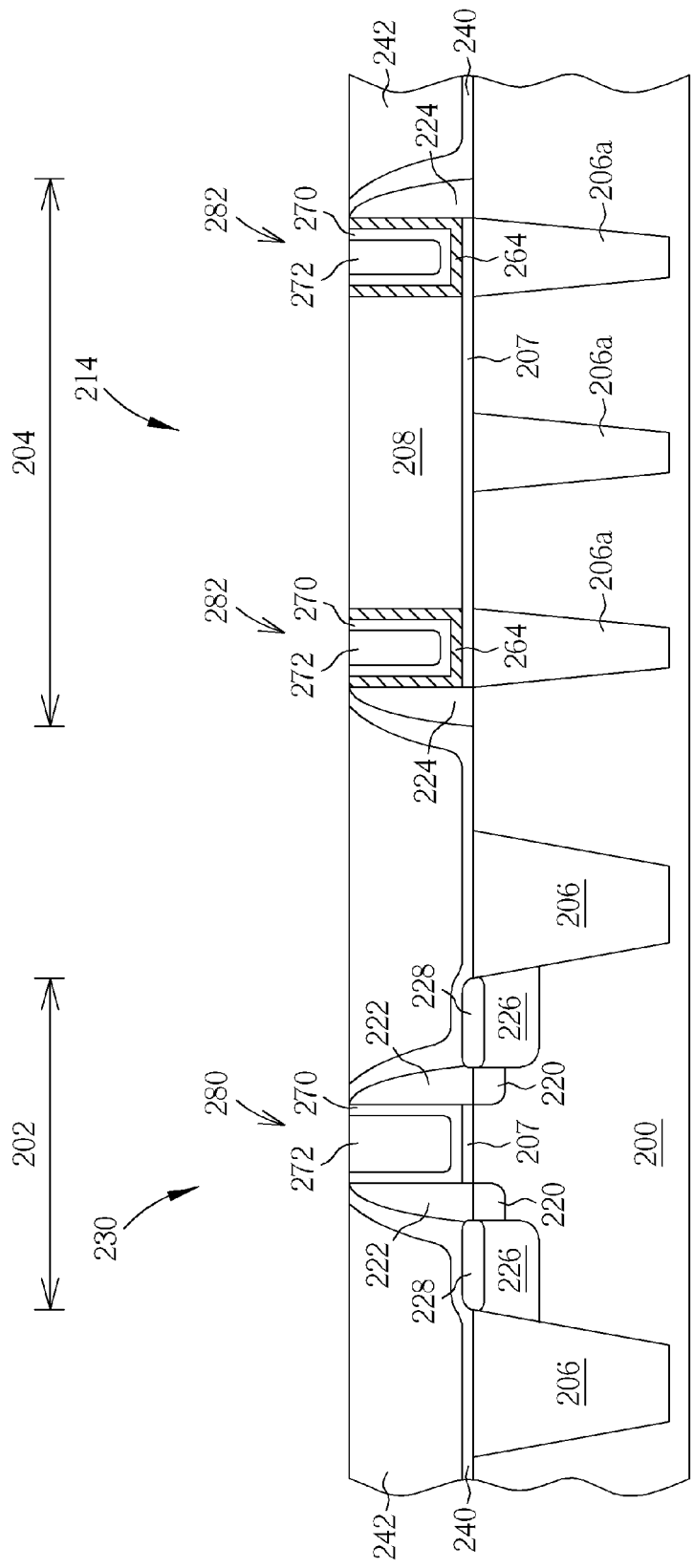
FIG. 16 is a schematic drawing illustrating a modification to both of the first preferred embodiment and the second preferred embodiment.

Please refer to FIG. 16, which is a schematic drawing illustrating a modification to both of the first and second preferred embodiments. As shown in FIG. 16, the resistor region 204 includes a plurality of STIs 206a, which includes size different from the STI 206 in the transistor region 202. Furthermore, the two opposite ends of the polysilicon layer 208 in the resistor region 214 are respectively corresponding to one STI 206a. Therefore the first trenches 254 are respectively formed on one of the STIs 206a with the STI 206a exposing in bottoms of the first trenches 254. Accordingly, the metal structures serving as the conductive terminals 282 are respectively formed on the STIs 206a or embedded in the STIs 206a with the STIs 206a providing electrical isolation between the conductive terminals 282 and the substrate 202.

According to the resistor and the manufacturing method provided by the present invention, the first trenches and the second trench for forming the conductive terminals and the metal gate are formed sequentially and separately, therefore the polysilicon lose problem that always found when simultaneously removing the first trenches and the second trench is mitigated. Furthermore, by forming the patterned protecting layer in the first trenches, the polysilicon lose problem is completely avoided, and thus profiles of the polysilicon portion of the resistor is remained intact. Consequently, resistance, reliability and stability of the resistor are all ensured.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistor integrated with a transistor having metal gate comprising:
    a substrate having a transistor region and a resistor region defined thereon;
    a transistor positioned in the transistor region, the transistor further comprising a metal gate; and
    a resistor positioned in the resistor region, the resistor further comprising:
        a polysilicon portion;
        a pair of conductive terminals respectively positioned at two opposite ends of the polysilicon portion, the conductive terminals and the metal gate comprising a same structure; and
        two protecting layers respectively positioned in between the polysilicon portion and the conductive terminal; and
    wherein the substrate comprises at least a shallow trench isolation (STI) formed in the resistor region, and the conductive terminals are positioned on the STI; and
    wherein a portion of the conductive terminals and a portion of the protecting layers are embedded in the STI, and bottoms of the conductive terminals and the protecting layers are lower than a surface of the STI.

2. The resistor integrated with the transistor having metal gate according to claim 1, wherein the protecting layer comprises conductive materials.

3. The resistor integrated with the transistor having metal gate according to claim 1, wherein the protecting layer comprises metal silicide.

4. The resistor integrated with the transistor having metal gate according to claim 1, wherein the protecting layer is formed between the conductive terminal and the substrate.

5. The resistor integrated with the transistor having metal gate according to claim 1, wherein the conductive terminals and the metal gate comprise at least a work function metal layer and a filling metal layer.

6. The resistor integrated with the transistor having metal gate according to claim 1, wherein the transistor further comprises a high-k gate dielectric layer.

* * * * *